US006425066B1

(12) United States Patent
Moreaux et al.

(10) Patent No.: US 6,425,066 B1
(45) Date of Patent: Jul. 23, 2002

(54) INTEGRATED CIRCUIT COMPRISING AT LEAST TWO MEMORIES

(75) Inventors: Christophe Moreaux, Eguilles; Bruno Leconte, Rousset, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/313,926

(22) Filed: May 18, 1999

(30) Foreign Application Priority Data

Jun. 5, 1998 (FR) .............................................. 98 07200

(51) Int. Cl.[7] .............................................. G06F 12/00
(52) U.S. Cl. ...................... 711/212; 711/170; 711/211
(58) Field of Search ................................. 710/307, 315; 711/170, 171, 172, 173, 211, 212

(56) References Cited

U.S. PATENT DOCUMENTS 5,323,356 A    6/1994  Okunaga ............... 365/230.01
5,396,608 A    3/1995  Garde ........................ 395/400
5,535,342 A  * 7/1996  Taylor
5,737,767 A    4/1998  Agrawal et al. ............. 711/171

FOREIGN PATENT DOCUMENTS

EP         0 337 457 A2      4/1989

* cited by examiner

*Primary Examiner*—Matthew Kim
*Assistant Examiner*—Christian P. Chace
(74) *Attorney, Agent, or Firm*—Lisa K. Jorgenson; Allen, Dyer, Doppelt, Milbrath & Gilchrist, P.A.

(57) ABSTRACT

An integrated circuit includes a first and second memory, with the first memory being configurable between a first data format and a second data format. An external address bus is connected to the second memory, and an internal bus is connected to the first memory. A rerouting circuit is connected between the external address bus and the internal bus. The rerouting circuit forms one of two connections between the external address bus and the internal bus dependent upon the configuration of the first memory.

29 Claims, 2 Drawing Sheets

INTEGRATED CIRCUIT COMPRISING AT LEAST TWO MEMORIES

FIELD OF THE INVENTION

The invention relates to integrated circuits and, more particularly, to an integrated circuit having at least two memories with different data formats.

BACKGROUND OF THE INVENTION

For microprocessor systems, several types of memories are commonly used. For example, a microcomputer may simultaneously have RAM, ROM, EPROM, EEPROM and Flash type memories. Naturally, these different types of memories may have different capacities and use different data formats corresponding to the function of each memory. Thus, in a given system, it is possible, for example, to have a flash memory with an 8 Mbit capacity whose data elements are organized in 8 bits while simultaneously having a 256 Kbit EEPROM whose data elements are organized in 8 bits. On the contrary, another system may require a flash memory with a capacity of 8 Mbits whose data is organized in 16 bits, while simultaneously requiring a 256 Kbit EEPROM type memory whose data elements are organized in 8 bits.

The maximum integration of circuits within a chip makes it possible to provide electronic systems with greater reliability and also tends to reduce their cost. If two different memories were integrated on the same chip, a silicon manufacturer can easily build two different integrated circuits. One circuit includes a flash memory organized in 8 bits, and the other circuit includes a flash memory organized in 16 bits. For the semiconductor manufacturer, it is preferable to manufacture a single circuit that can be used instead of these two circuits. This would serve the purpose of reducing costs and manufacturing time.

While there are known ways of making parallel access memories that can be configured in at least two different data formats, a problem arises when a configurable memory is coupled in the same circuit with at least one other memory that is non-configurable or configured independently. The two memories can be accessed by the same address bus. For a configurable memory, the address bus has a variable size depending on the configuration of the data format and, conventionally, the added address bit corresponds to a least significant bit.

Furthermore, if the memories have page (read or write) access systems, then all the address bits that address different words in the same page have to be assembled in least significant bits. The result of these constraints is that it is not possible to couple a memory that is configurable in two data formats with a second memory that would have page access and/or would be also configurable.

SUMMARY OF THE INVENTION

An object of the present invention is to resolve the problem of integrating at least two memories in an integrated circuit by having at least one of the memories configurable according to one of two data formats. To connect the two memories, at least one routing circuit is added for rerouting two, or two out of four address wires in the integrated circuit to address at least one of the memories as a function of the configuration of the configurable memory.

The integrated circuit includes at last one first memory that is configurable according to first and second data formats. A first format selection input determines the data format of the first memory. The integrated circuit further includes a second memory. An external address bus provides an address to the integrated circuit. A first internal bus is connected to the external address bus by a first rerouting circuit. The first rerouting circuit makes either a direct connection of the address bus with the first internal bus, or a connection between the address bus and the first internal bus by rerouting two wires from the external address bus so that they have different place values. This connection is dependent upon whether a signal is present at the first selection input which indicates that the first memory is operating with the first format or with the second format. The first internal bus is connected to an address input of one of the two memories.

BRIEF DESCRIPTION OF THE DRAWINGS

The invention will be understood more clearly and other particular features and advantages shall appear from the following description, made with reference to the appended drawings, of which.

DETAILED DESCRIPTION OF THE PREFERRED EMBODIMENTS

FIGS. 1 to 4 give a simplified view of an integrated circuit 1 including a first memory MEM1 and a second memory MEM2. As readily appreciated by those skilled in the art, the integrated circuit can be changed to have a number of memories greater than two. Each of the memories MEM1 and MEM2 has a parallel address input, a parallel data input/output and a validation input. Naturally, other inputs dedicated to various checking and control signals may be used, but have not been shown so as not to excessively burden the figures.

The integrated circuit 1 has a data bus 2 connected firstly to a data input/output E/S of the integrated circuit 1, and secondly to the-data inputs/outputs of the first and second memories MEM1 and MEM2. The integrated circuit 1 also has a parallel type address input to receive external to the integrated circuit an address intended for the first and second memories MEM1 and MEM2. Two validation inputs EN1 and EN2 of the integrated circuit 1 are respectively connected to the validation inputs of the first and second memories MEM1 and MEM2.

Figure 1:
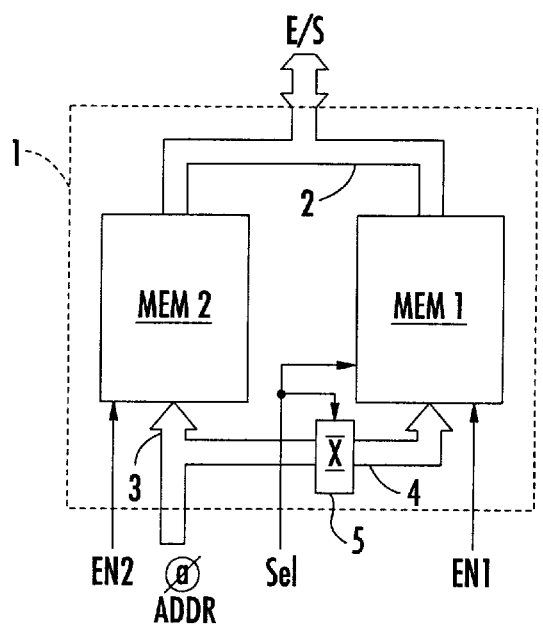
FIGS. 1 to 4 respectively show four embodiments of an integrated circuit incorporating two memories according to the present invention.
Figure 2:
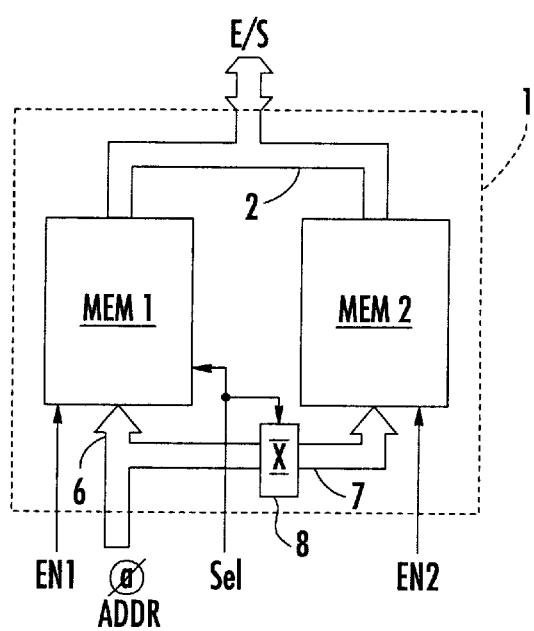

FIGS. 1 and 2 correspond to an integrated circuit 1 in which the first memory MEM1 is configurable and the second memory MEM2 uses a fixed data format. The first memory MEM1 has a selection input designed to receive a selection signal Sel.

In the circuit of FIG. 1, it is assumed that the first memory MEM1 has a size, in terms of memory capacity, that is not greater than the size of the second memory MEM2. In this case, the integrated circuit 1 has an address bus 3, called an external bus, which is connected between the address input of the second memory MEM1 and the address input of the integrated circuit 1. Those skilled in the art understand that circuits can be added to this address bus to operate as input buffers, e.g., amplifiers, flip-flop circuits, etc., of the integrated circuit 1.

The address input of the first memory MEM1 is connected to an internal bus 4. The internal bus 4 is connected to the external address bus 3 by a rerouting circuit 5. The rerouting circuit 5 has a parallel input, a parallel output and a selection input. The selection input receives the selection signal Sel.

Figure 6:
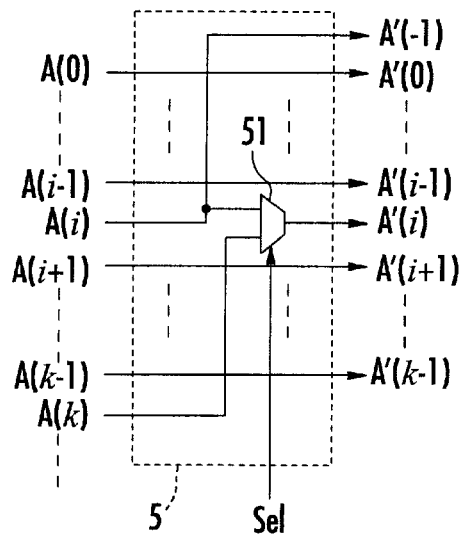

For further details on the rerouting circuit 5, reference may be made to FIG. 6. Since the first memory MEM1 is, for example, configurable in 8 bits or in 16 bits, it requires k address wires or k+1 address wires for its addressing, depending on the format. Furthermore, one page of the first memory MEM1 corresponds to i or i+1 address wires depending on the data format. Thus, the parallel input of the rerouting circuit 5 includes k+1 inputs referenced A(0) to A(k). The parallel output of the rerouting circuit 5 includes k+1 outputs referenced A'(-1) to A'(k-1). The k+1 inputs A(0) to A(k) correspond to the least significant address bits of the address provided to the integrated circuit 1 and to the second memory MEM2. The output A'(-1) corresponds to the least significant bit added when the first memory MEM1 operates in an 8 bit format.

The rerouting circuit 5 has a multiplexer 51 having first and second inputs and an output. The first input of the multiplexer 51 is connected to the input A(i). The second input of the multiplexer 51 is connected to the input A(k). The output of the multiplexer 51 is connected to the output A'(i). The inputs A(0) to A(i-1) and A(i+1) to A(k-1) are respectively connected to the outputs A'(0) to A'(i-1) and A'(i+1) and A'(k-1). The output A'(-1) is connected to the input A(i).

When the first memory MEM1 operates in a 16 bit format, the address bit with a place value -1 is ignored and may take any value. Furthermore, the selection signal Sel causes the multiplexer 51 to set up a connection between the input A(i) and the output A'(i). The address given to the first memory MEM1 is then the same as the address given to the second memory MEM2. The connection between the external address bus 3 and the internal bus 4 is made directly.

In contrast, when the first memory MEM1 operates in an 8 bit format, the address bit with a place value -1 is taken into account as the least significant address bit. The selection signal Sel causes the multiplexer 51 to set up a connection between the input A(k) and the output A'(i). The connection between the external address bus 3 and the internal bus 4 is made with a rerouting of the wires. The place values i and k of the external address bus 3 are connected to the wires with place values -1 and i of the internal bus 4. Although the bit added to the external address bus 3 is a bit that corresponds to the most significant value, the outputs A'(-1) to A'(i-1), which correspond to the addressing of the page of the first memory MEM1, correspond as a whole to the inputs A(0) to A(i) corresponding to the least significant wires of the external address bus 3.

Referring to the circuit of FIG. 2, it is assumed that the first memory MEM1 has a size in terms of memory capacity greater than the size of the second memory MEM2. In this case, the integrated circuit 1 has available an address bus 6, called an external bus, that is connected between the address input of the first memory MEM1 and the address input of the integrated circuit. The address input of the second memory MEM2 is connected to an internal bus 7. The internal bus 7 is connected to the external address bus 6 by a rerouting circuit 8. The rerouting circuit has a parallel input, a parallel output and a selection input. The selection input receives the selection signal Sel.

Figure 5:
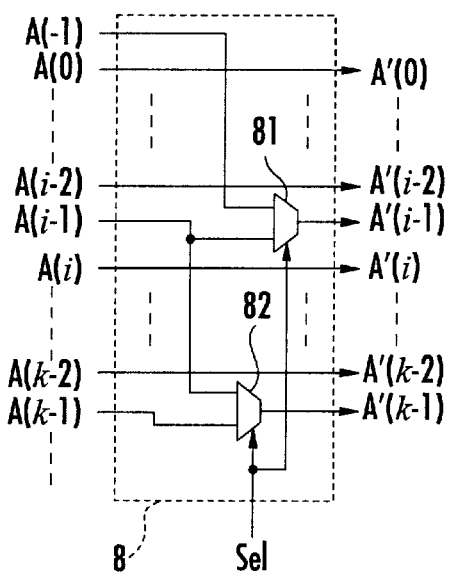
FIGS. 5 to 7 respectively show three embodiments of a rerouting circuit according to the present invention.

For further details on the rerouting circuit 8, reference is made to FIG. 5. Since the first memory MEM1 is, for example, configurable in 8 bits or 16 bits, it needs an additional address wire with low significance A(-1) to be addressed in the 8 bit mode. Furthermore, a page of the second memory MEM2 corresponds to i least significant address wires in a total of k address wires. Thus, the parallel input of the rerouting circuit 8 has k+1 inputs referenced A(-1) to A(k-1). The parallel output of the rerouting circuit includes k outputs referenced A'(0) to A'(k-1). The k+1 inputs A(-1) to A(k-1) correspond to the least significant address bits of the address given to the integrated circuit 1 and to the first memory MEM1.

The rerouting circuit 8 has first and second multiplexers 81 and 82, each having first and second inputs and one output. The first input of the first multiplexer 81 is connected to the input A(-1). The second input of the first multiplexer 81 is connected to the input A(i-1). The output of the first multiplexer 81 is connected to the output A'(i-1). The first input of the second multiplexer 82 is connected to the input A(i-1). The second input of the second multiplexer 82 is connected to the input A(k-1). The output of the second multiplexer 82 is connected to the output A'(k-1). The inputs A(0) to A(i-2) and A(i) to A(k-2) are respectively connected to the outputs A'(0) to A'(i-2) and A'(i) to A'(k-2).

When the first memory MEM1 operates in a 16 bit format, the address bit with the place value -1 is unused and, therefore, normally unconnected. The selection signal Sel positions the first multiplexer 81 to set up a connection between the input A(i-1) and the output A'(i-1). The selection signal also causes a second multiplexer 82 to set up a connection between the input A(k-1) and the output A'(k-1). The address given to the first memory MEM1 is then the same as the address given to the second memory MEM2. The connection between the external address bus 6 and the internal bus 7 is done directly.

In contrast, when the first memory MEM1 operates in 8 bit format, the address bit with a place value -1 is taken into account as the least significant address bit and is then used. The selection signal Sel causes the first multiplexer 81 to set up a connection between the input A(-1) and the output A'(i-1). The selection signal Sel also causes the second multiplexer 82 to set up a connection between the input A(i-1) and the output A'(k-1). The connection between the external address bus 6 and the internal bus 7 is made with a rerouting of the wires. A place value -1 and i-1 of the external address bus 6 are connected to the wires with place values i-1 and k-1 of the internal bus 7. The bit added to the external address bus 6 is shifted to be the most significant bit of an address of the page of the second memory MEM2 so that the addressing of the page of the second memory MEM2 corresponds as a whole to the inputs A(-1) to A(i-1) corresponding to the least significant wires of the external address bus 6.

For the examples described above, a direct correspondence between addresses with identical place values has been used. It is quite possible to obtain a shifted direct correspondence. For FIG. 6, this would mean having the inputs A(0) to A(k) connected directly and respectively to the outputs A'(-1) to A'(k-1), as well as rerouting the inputs A(0) and A(i) respectively to the outputs A'(i-1) and A'(k-1). For FIG. 5, this would mean having the inputs A(-1) to A(k-2) connected directly and respectively to the outputs A'(0) to A'(k-1), as well as rerouting the inputs A(i-1) and A(k-2) respectively to the outputs A'(0) and A'(i).

More generally, in one case, this means that the rerouting circuit reroutes the least significant address wire of the external address bus (when this wire has to be rerouted) to an intermediately significant address wire of the internal bus. The rerouting circuit also reroutes the address wire corresponding to the intermediate place value of the external address bus to the most significant address wire of the internal bus. In order to perform a minimum number of rerouting operations, the intermediately significant address wire corresponds to the most significant address wire that can address a page of the memory that is connected to the internal bus.

Again, in another case, the rerouting circuit reroutes the most significant address wire of the external address bus (when this wire has to be rerouted) to a wire with a defined place value of the internal bus. The rerouting circuit also reroutes the address wire corresponding to the defined place value of the external address bus to the least significant wire of the internal bus. In order to perform a minimum number of rerouting operations, the wire with a defined place value corresponds to the address wire with a place value immediately higher than the most significant address wire that can address a page of the memory connected to the internal bus. In order that the addresses of the memory connected to the internal bus may be successive, it is preferable that the most significant wire of the external address bus should correspond to the address place value immediately higher than the most significant value of the memory connected to the internal bus.

Figure 3:
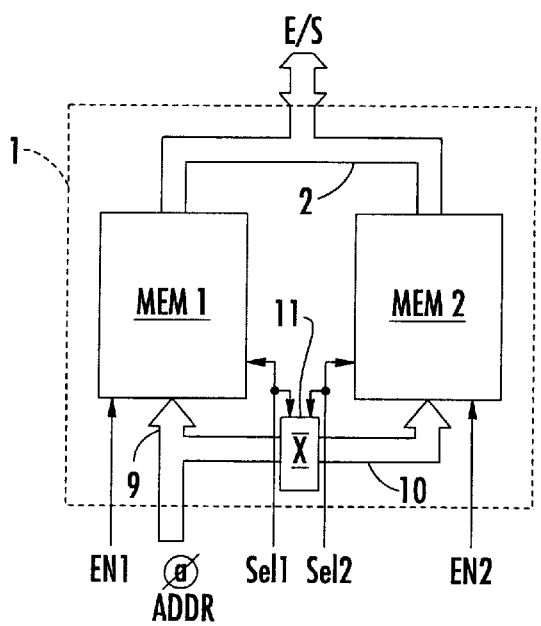
Figure 4:
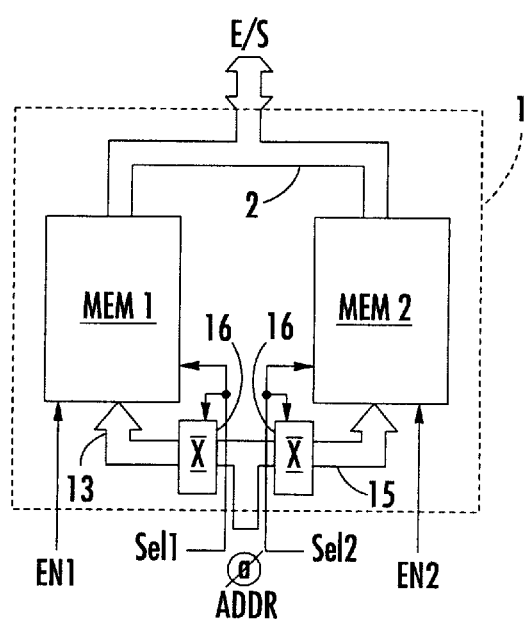

FIGS. 3 and 4 correspond to an integrated circuit 1 in which the first memory MEM1 is configurable and the second memory MEM2 is also configurable. The first memory MEM1 has available a selection input designed to receive a first format selection signal Sel1. The second memory MEM2 has a selection input designed to receive a second format selection signal Sel2.

In the circuit of FIG. 3, it is considered that the first memory MEM1 has a size in terms of memory capacity greater than the size of the second memory MEM2. In this case, the integrated circuit 1 has an address bus 9, called an external bus, that is connected between the address input of the first memory MEM1 and the address input of the integrated circuit 1. The address input of the second memory MEM2 is connected to an internal bus 10. The internal bus 10 is connected to the external address bus 9 by a rerouting circuit 11. The rerouting circuit 11 has a parallel input, a parallel output and first and second selection inputs. The first and second selection inputs respectively receive the first and second selection signals Sel1 and Sel2.

Figure 7:
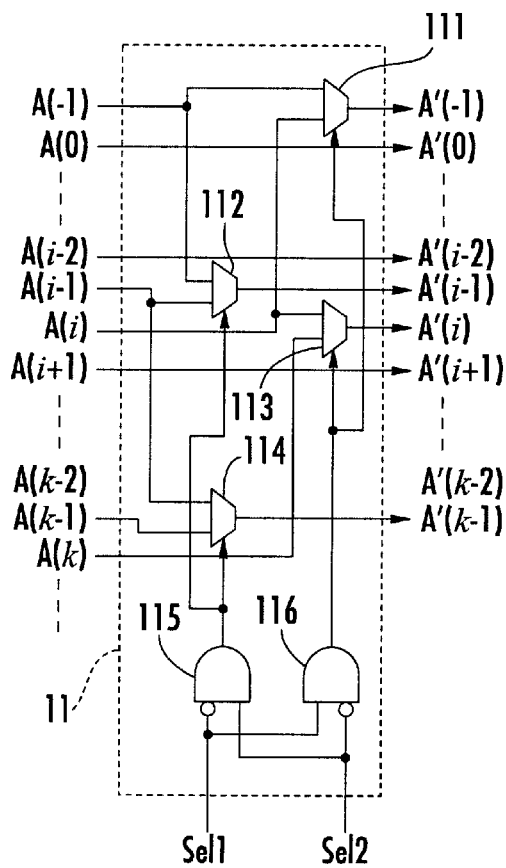

For further details on the rerouting circuit 11, reference is made to FIG. 7. Since the first and second memories MEM1 and MEM2 are, for example, configurable in 8 bits or 16 bits, they need an additional least significant address wire A(−1) and A'(−1) to be addressed in an 8 bit mode. Furthermore, one page of the second memory MEM2 corresponds to i or i+1 least significant address wires on a total of k or k+1 address wires. Thus, the parallel input of the rerouting circuit 11 has k+2 inputs referenced A(−1) to A(k), and the parallel output of the rerouting circuit 11 has k+1 outputs referenced A'(−1) to A'(k−1). The k+2 inputs A(−1) to A(k) correspond to the least significant address bits of the address provided to the integrated circuit 1 and to the first memory The rerouting circuit 11 has first to fourth multiplexers 111 to 114, each having first and second inputs and one output, and first and second decoding gates 115 and 116. The first input of the first multiplexer 111 is connected to the input A(−1). The second input of the first multiplexer 111 is connected to the input A(i). The output of the first multiplexer 111 is connected to the output A'(−1). The first input of the second multiplexer 112 is connected to the input A(−1). The second input of the second multiplexer 112 is connected to the input A(i−1). The output of the second multiplexer 112 is connected to the output A'(i−1). The first input of the third multiplexer 113 is connected to the input A(i). The second input of the third multiplexer 113 is connected to the input A(k). he output of the third multiplexer 113 is connected to he output A'(i). The first input of the fourth multiplexer 114 is connected to the input A(i−1). The second input of the fourth multiplexer 114 is connected to the input A(k−1). The output of the fourth multiplexer 114 is connected to the output A'(k−1). The inputs A(0) to A(i−2) and A(i+1) to A(k−2) are respectively connected to the outputs A'(0) to A'(i−2) and A'(i+1) to A'(k−2).

The first and second gates 115 and 116 each receive first and second selection signals Sel1 and Sel2. The first gate 115 provides a control signal for the second and fourth multiplexers 112 and 114. The second gate 116 provides a control signal for the first and third multiplexers 111 and 113. The first and second gates are used to select the different combinations of connection as a function of selection signals Sel1 and Sel2.

When the first and second memories MEM1 and MEM2 operate with the same format, the selection signals Sel1 and Sel2 use the gates 115 and 116 to cause the first multiplexer 111 to set up a connection between the input A(−1) and the output A'(−1); the second multiplexer 112 to set up a connection between the input A(i−1) and the output A'(i−1); the third multiplexer 113 to set up a connection between the input A(i) and the output A'(i); and the fourth multiplexer 114 to set up a connection between the input A(k−1) and the output A'(k−1). The address provided to the first memory MEM1 is then the same as the address provided to the second memory MEM2. The connection between the external bus 9 and the internal bus 10 is made directly. When the first and second memories MEM1 and MEM2 are positioned so that both operate in 16 bits, the connection set up between A(−1) and A'(−1) is unnecessary but is made for reasons of simplifying the circuit configuration.

When the first memory MEM1 is configured to operate in 16 bits and the second memory MEM2 is configured to operate in 8 bits, the selection signals Sel1 and Sel2 use the gates 115 and 116 to cause the first multiplexer 111 to set up a connection between the input A(i) and the output A'(−1); the second multiplexer 112 to set up a connection between the input A(i−1) and the output A'(i−1); the third multiplexer 113 to set up a connection between the input A(k) and the output A'(i); and the fourth multiplexer 114 to set up a connection between the input A(k−1) and the output A'(k−1). The connection between the external address bus 9 and the internal bus 10 is done with a rerouting of the wires with place values i and k of the external address bus to the wires with place values −1 and i of the internal bus. This operation is similar to the address rerouting done by the rerouting circuit 5 of FIG. 6.

When the first memory MEM1 is configured to operate in 8 bits and the second memory MEM2 is configured to operate in 16 bits, the selection signals Sel1 and Sel2 use the gates 115 and 116 to position the first multiplexer 111 to set up a connection between the input A(−1) and the output A'(−1); the second multiplexer 112 to set up a connection between the input A(−1) and the output A'(i−1); the third multiplexer 113 to set up a connection between the input A(i) and the output A'(i); and the fourth multiplexer 114 to set up a connection between the input A(i−1) and the output A'(k−1). The connection between the external address bus 9 and the internal bus 10 is done with a rerouting of the wires with place values −1 and i−1of the external address bus 9 to the wires with place values i−1 and k−1of the internal bus 10. This operation is similar to the address rerouting done by the rerouting circuit 8 of FIG. 5.

The rerouting circuit 11 makes either a direct connection between the internal bus and the external address bus when the two memories are configured with the same format, or a connection between the address bus and the first internal bus by rerouting two out of four wires when the two memories are configured differently. The observations made with reference to FIGS. 1 and 2 can be applied also to the drawing of FIG. 3. Furthermore, for the drawings of FIGS. 1 to 3, it is always the memory with the greater size that has been connected to the external address bus. Although this is not necessary, it is preferable to avoid having, in certain cases, an additional connection pad on the chip.

In the circuit of FIG. 4, a representation has been given of a method for making the integrated circuit 1 that can be easily changed to include any number of memories. In FIG. 4, the integrated circuit 1 has an address bus 12 called an external bus that is connected to the address bus of the integrated circuit 1. The address input of the first memory MEM1 is connected to a first internal bus 13. The first internal bus 13 is connected to the external address bus 12 by a first rerouting circuit 14. The address input of the second memory MEM2 is connected to a second internal bus 15. The second internal bus 15 is connected to the external address bus 12 by a second rerouting circuit 16.

Each of the rerouting circuits 14 and 16 includes a parallel input, a parallel output and a selection input. The selection inputs of the first and second rerouting circuits respectively receive the first and second selection signals Sel1 and Sel2. With regards to the first and second rerouting circuits 14 and 16, they are formed identically or in a manner equivalent to the rerouting circuit 5 of FIG. 6. However, the inputs A(0) to A(k) of this FIG. 6 must be considered solely as the address input seen external to the circuit.

Thus, the first rerouting circuit 14 performs either a direct connection of the external address bus 12 with the first internal bus 13, or a rerouted connection between the external address bus 12 and the first internal bus 13. This connection is made by rerouting two wires of the external address bus 12 to different place values as a function of the first signal Sel1, which indicates that the first memory MEM1 is operating in the 8 bit format or the 16 bit format. The second rerouting circuit 16 makes either a direct connection of the external address bus 12 with the second internal bus 15, or a rerouted connection between the external address bus 12 and the second internal bus 15. This connection is made by rerouting two wires of the external address bus 12 to different place values as a function of the second signal Sel2, which indicates that the second memory MEM2 is operating in the 8 bit or 16 bit format.

For the embodiment of FIG. 4, the integrated circuit 1 has two memories operating independently of each other. The addition of a third memory to the drawing of FIG. 4 requires the addition of a third internal bus and a third rerouting circuit. he implementation of the third memory must be based on the implementation of the first or second memory.

Numerous variations are available to those skilled in the art without departing from the framework of the invention. In addition to the possible variations that have already been mentioned, all the numerical information given as examples may be modified according to different operating requirements, as understood by those skilled in the art.

That which is claimed is:

1. An integrated circuit comprising:
    at least one first memory configurable between a first data format and a second data format responsive to a data format selection signal;
    a second memory;
    an external address bus comprising a plurality of address wires;
    a first internal bus connected to said at least one first memory and comprising a plurality of wires; and
    a first rerouting circuit connected between said external address bus and said first internal bus providing one of a direct connection and a modified connection by rerouting at least two address wires of said external address bus to different wires of said first internal bus so that they have a different place value as compared to the direct connection, said first rerouting circuit responsive to the first data format selection signal.

2. An integrated circuit according to claim 1, wherein a least significant address wire of said external address bus is connected by said first rerouting circuit to an intermediately significant wire of said first internal bus, and an intermediately significant address wire of said external address bus is connected by said first rerouting circuit to a most significant wire of said first internal bus.

3. An integrated circuit according to claim 2, wherein the intermediately significant address wire corresponds to the most significant wire addressing a page of said at least one first memory.

4. An integrated circuit according to claim 1, wherein a most significant address wire of said external address bus is connected by said first rerouting circuit to a wire with a defined place value of said first internal bus, and an address wire of the defined place value of said external address bus is connected by said first rerouting circuit to a least significant wire of said first internal bus.

5. An integrated circuit according to claim 4, wherein the wire with the defined place value corresponds to the address wire with a place value immediately higher than that of a most significant address wire addressing a page of said at least one first memory.

6. An integrated circuit according to claim 4, wherein the most significant address wire of said external address bus corresponds to an address place value immediately higher than a most significant value of said at least one first memory.

7. An integrated circuit according to claim 1, wherein said second memory is configurable between the first and second data formats responsive to a second data format selection signal.

8. An integrated circuit according to claim 7, wherein said first rerouting circuit forms a direct connection between said first internal bus and said external address bus when said at least one first memory and said second memory are configured in a same data format, and said first rerouting circuit forms a modified connection between said external address bus and said first internal bus when said at least one first memory and said second memory are configured in different data formats.

9. An integrated circuit according to claim 7, further comprising:
    a second internal bus connected to said second memory and comprising a plurality of wires; and
    a second rerouting circuit connected between said external address bus and said second internal bus providing one of a direct connection and a modified connection by rerouting at least two address wires of said external address bus to different wires of said second internal bus so that they have a different place value as compared to the direct connection.

10. An integrated circuit according to claim 1, wherein said at least one first memory has a first size and said second memory has a second size, and wherein said at least one first memory is connected to said external address bus and said second memory is connected to said first internal bus if the first size is greater than the second size, and if the first size is less than the second size then said at least one first memory is connected to said first internal bus and said second memory is connected to said at least one external address bus.

11. An integrated circuit comprising:
   a first memory configurable between a first data format and a second data format responsive to a first data format selection signal;
   a second memory configurable between a first data format and a second data format responsive to a second data format selection signal;
   an external address bus comprising a plurality of address wires;
   a first internal bus connected to said first memory and comprising a plurality of wires;
   a second internal bus connected to said second memory and comprising a plurality of wires;
   a first rerouting circuit connected between said external address bus and said first internal bus providing one of a direct connection and a modified connection by rerouting at least two address wires of said external address bus to different wires of said first internal bus so that they have a different place value as compared to the direct connection, said first rerouting circuit responsive to the first data format selection signal; and
   a second rerouting circuit connected between said external address bus and said second internal bus providing one of a direct connection and a modified connection by rerouting at least two address wires of said external address bus to different wires of said second internal bus so that they have a different place value as compared to the direct connection, said second rerouting circuit responsive to the second data format selection signal.

12. An integrated circuit according to claim 11, wherein a least significant address wire of said external address bus is connected by said first rerouting circuit to an intermediately significant wire of said. first internal bus, and an intermediately significant address wire of said external address bus is connected by said first rerouting circuit to a most significant wire of said first internal bus.

13. An integrated circuit according to claim 12, wherein the intermediately significant address wire corresponds to the most significant wire addressing a page of said first memory.

14. An integrated circuit according to claim 11, wherein a least significant address wire of said external address bus is connected by said second rerouting circuit to an intermediately significant wire of said second internal bus, and an intermediately significant address wire of said external address bus is connected by said second rerouting circuit to a most significant wire of said second internal bus.

15. An integrated circuit according to claim 12, wherein the intermediately significant address wire corresponds to the most significant wire addressing a page of said second memory.

16. An integrated circuit according to claim 11, wherein a most significant address wire of said external address bus is connected by said first rerouting circuit to a wire with a defined place value of said first internal bus, and an address wire of the defined place value of said external address bus is connected by said first rerouting circuit to a least significant wire of said first internal bus.

17. An integrated circuit according to claim 16, wherein the wire with the defined place value corresponds to the address wire with a place value immediately higher than that of a most significant address wire addressing a page of said first memory.

18. An integrated circuit according to claim 16, wherein the most significant address wire of said external address bus corresponds to an address place value immediately higher than a most significant value of said first memory.

19. An integrated circuit according to claim 11, wherein a most significant address wire of said external address bus is connected by said second rerouting circuit to a wire with a defined place value of said second internal bus, and an address wire of the defined place value of said external address bus is connected by said second rerouting circuit to a least significant wire of said second internal bus.

20. An integrated circuit according to claim 16, wherein the wire with the defined place value corresponds to the address wire with a place value immediately higher than that of a most significant address wire addressing a page of said second memory.

21. An integrated circuit according to claim 16, wherein the most significant address wire of said external address bus corresponds to an address place value immediately higher than a most significant value of said second memory.

22. A method of coupling at least two memories in an integrated circuit comprising at least one first memory being configurable between a first data format and a second data format, and a second memory, an external address bus, and a first internal bus connected to the at least one first memory, the method comprising the step of:
   forming a direct connection between the external address bus and the internal bus if the at least one first memory and the second memory are operating in a same data format, and if the at least one first memory and the second memory are operating in different data format, then forming a modified connection such that at least two address wires of the external address bus are rerouted from the external address bus to the first internal bus providing a different place value for at least two address bits.

23. A method according to claim 22, wherein the step of forming a direct connection is responsive to a signal present at a data format selection input of the at least one first memory indicating that the memory is operating in one of the first data format and the second data format.

24. A method according to claim 22, wherein the step of forming a modified connection comprises:
   connecting a least significant address wire of the external address bus to an intermediately significant wire of the first internal bus; and
   connecting an intermediately significant address wire of the external address bus to a most significant wire of the first internal bus.

25. A method according to claim 24, wherein the intermediately significant wire corresponds to the most significant address wire addressing a page of the at least one first memory.

26. A method according to claim 22, wherein the step of forming a modified connection comprises:
   connecting a most significant address wire of the external address bus to a wire with a defined place value of the first internal bus; and
   connecting an address wire of the defined place value of the external address bus to a least significant wire of the first internal bus.

27. A method according to claim 26, wherein the wire with the defined place value corresponds to the address wire with a place value immediately higher than that of the most significant address wire addressing a page of the at least one first memory.

28. A method according to claim 26, wherein the most significant address wire of the external address bus corresponds to an address place value immediately higher than a most significant value of the at least one first memory.

29. A method according to claim 22, wherein both memories are configurable between the first data format and the second data format.

* * * * *